United States Patent [19]
Sahlström et al.

[11] Patent Number: 5,793,190
[45] Date of Patent: Aug. 11, 1998

[54] METHOD AND DEVICE FOR POWER CONVERSION

[75] Inventors: Thomas Sahlström; Christer Thoren, both of Hägerstein, Sweden

[73] Assignee: Telefonaktiebolaget LM Ericsson, Stockholm, Sweden

[21] Appl. No.: 786,735

[22] Filed: Jan. 27, 1997

[30] Foreign Application Priority Data

Jan. 24, 1997 [SE] Sweden ................................ 9700210

[51] Int. Cl.$^6$ ............................................. G05F 1/656
[52] U.S. Cl. ................................................ 323/222
[58] Field of Search ............................ 323/222, 223, 323/235, 282; 363/16, 97, 124, 131

[56] References Cited

U.S. PATENT DOCUMENTS

| | | | |
|---|---|---|---|
| 4,346,431 | 8/1982 | Steigerwald | 363/27 |
| 5,313,382 | 5/1994 | Farrington | 363/16 |
| 5,457,379 | 10/1995 | Jacobs et al. | 323/222 |
| 5,461,302 | 10/1995 | Garcia et al. | 323/222 |
| 5,543,704 | 8/1996 | Thorén | 323/222 |
| 5,550,458 | 8/1996 | Farrington et al. | 323/222 |
| 5,633,579 | 5/1997 | Kim | 323/222 |

FOREIGN PATENT DOCUMENTS 0 649 214 A2  4/1995  European Pat. Off. .

WO 95/22092  8/1995  WIPO .

*Primary Examiner*—Matthew V. Nguyen
*Attorney, Agent, or Firm*—Burns, Doane, Swecker & Mathis, L.L.P.

[57] ABSTRACT

As a front end power factor correction circuit in a rectifier a boost conversion topology is often used. A great problem with this topology is the rectifier diode. This diode must be of a high voltage type in a boost application and will therefore have a large reverse-recovery current before it will block the voltage. This current may cause large losses. With the solution according to the invention care will be taken to the recovery current in a more effective way than any earlier solution has obtained. The proposed circuit comprises essentially a boost circuit, where a main and first inductor L1(3) and a main and first diode D1(4) are connected in series from an input to an output and a main and first capacitor C1(5) from an output to ground. A main and first transistor M1(1) is connected from between the first inductor L1(3) and the first diode D1(4) to ground. An auxiliary and second inductor L11(6), a second diode D11(7) and a second transistor M11(2) are connected in series from between the first inductor L1(3) and the first diode D1(4) to ground. Two other diodes a third and fourth diode D12(10), D13(9) are connected in series from between the second diode D11(7) and the second transistor M11(2) to the output.

19 Claims, 2 Drawing Sheets

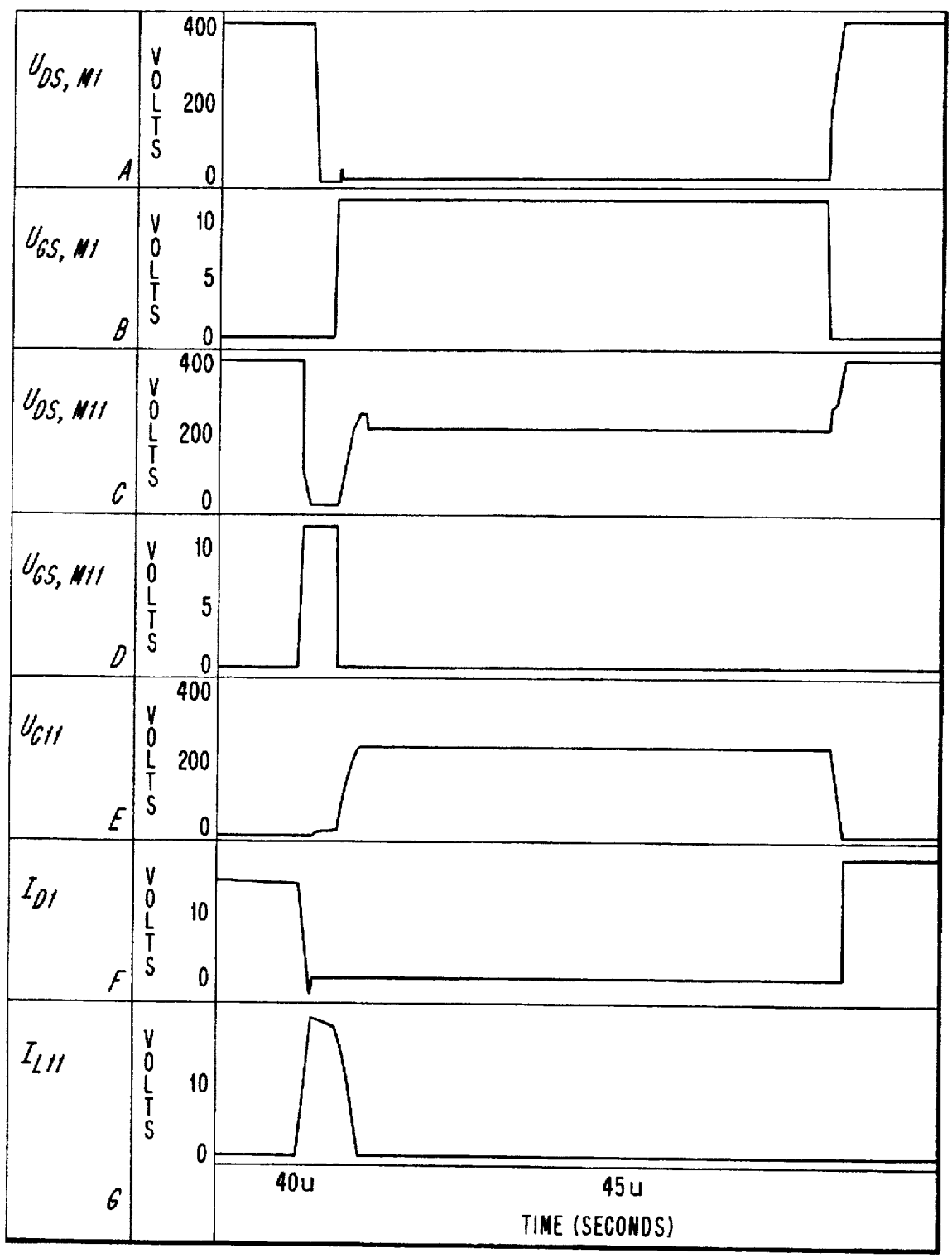
Fig. 3A-G

METHOD AND DEVICE FOR POWER CONVERSION

TECHNICAL FIELD

The present invention relates to a method for power conversion using boost topology with a loss-less snubber circuit and a device for power conversion using boost topology with a loss-less snubber circuit.

BACKGROUND OF THE INVENTION

A boost DC/DC converter is usually chosen to be the front end power stage in an AC/DC converter. The output voltage is always higher than the peak value of the main voltage, which means that the output voltage of the boost converter is more than 300 V. A typical value would be about 400 V in European applications. At these high voltage levels the boost diode may exhibit large reverse recovery currents in the precise moment, when the active switch, the transistor, is turned on. The reverse recovery current will cause high losses at high frequency switching, which in practice will be a limiting factor for the choice of switching frequency.

In for example U.S. Pat. No. 5,543,704 a boost converter circuit is described, wherein the switching losses will be minimized by the boost converter by using zero voltage switching techniques.

SUMMARY OF THE INVENTION

As a front end power factor correction circuit in a rectifier a boost conversion topology is often used. A great problem with this topology is the rectifier diode. This diode must be of a high voltage type in a boost application and will therefore have a large reverse-recovery current before it will block the voltage. This current may cause large losses. With the solution according to the invention care will be taken to the recovery current in a more effective way than any earlier solution has obtained.

With a loss-less snubber circuit according to the invention a boost converting is obtained, where the proposed circuit will:

minimize the reverse recovery current in a diode of a boost converter eliminate the turn-on losses of a main switch minimize the turn-on losses of an auxiliary switch minimize the turn-off losses of an auxiliary switch minimize the reverse recovery current in auxiliary diodes eliminate the oscillations when the auxiliary diodes turn off minimize the turn-off losses of the main switch minimize the current in an auxiliary inductor, when the main transistor is turned off.

The proposed circuit comprises a boost circuit, where a main and first inductor L1 and a main and first rectifying element as a diode D1 are connected in series from an input to an output and a main and first capacitor C1 from output to ground. A main and first electronic switch as a transistor M1 is connected from between the first inductor L1 and the first diode D1 to ground. An auxiliary and second inductor L11, a second rectifying element as a diode D11 and a second electronic switch as a transistor M11 are connected in series from between the first inductor L1 and the first diode D1 to ground. Two other rectifying elements as diodes, a third and fourth diode D12, D13 are connected in series from between the second diode D11 and the second transistor M11 to the output. A second capacitor C11 is connected from between the other two diodes D12, D13 to between the first inductor L1 and the first diode D1. A further rectifying element as a diode, a fifth diode D14 in series with a first resistor R14 is connected in parallel with the second capacitor C11. A last rectifying element as a diode, a sixth diode D15 in series with a second resistor R15 is connected from ground to between the auxiliary and second inductor L11 and the second diode D11.

DESCRIPTION OF THE DRAWINGS

FIGS. 3 A–G show voltage and current waveforms, which illustrate the switching cycle of the circuit of FIG. 1.

DESCRIPTION OF THE PREFERRED EMBODIMENT

Figure 1:
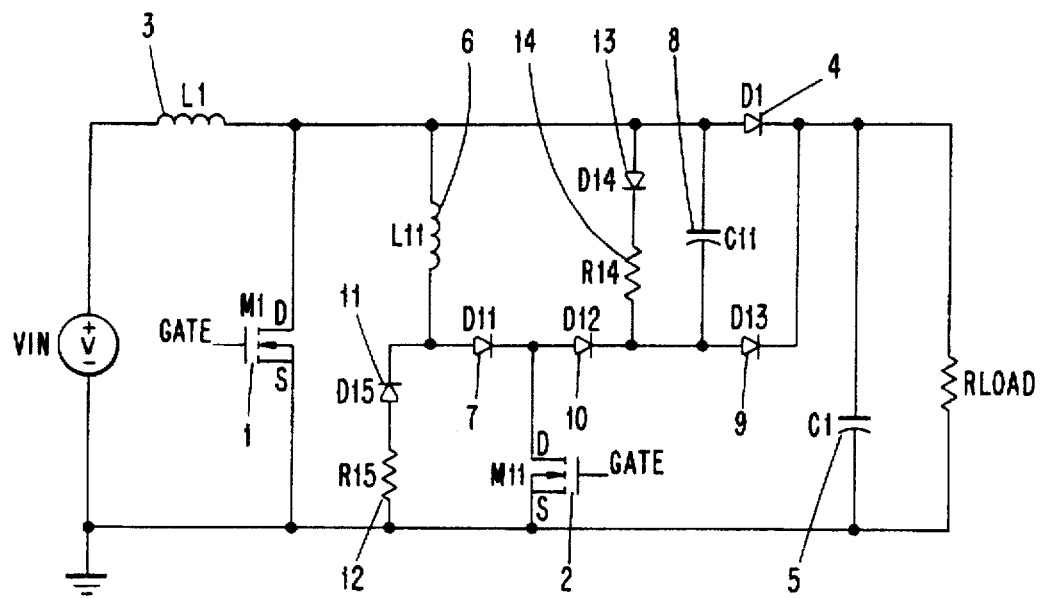
FIG. 1 is a circuit of a boost converter with loss-less snubber according to the invention.

In the FIG. 1 is shown the circuit according to the invention, where a main and first transistor M1/1 is turned on a constant delay time after a second transistor M11/2 is turned on. The on-time of the second transistor M11/2 is constant and the on-time of the first transistor M1/1 is regulated. Initially a current will flow through a main and first inductor L1/3 and a main and first diode D1/4 from an input to an output. A main and first capacitor C1/5 is connected from output to ground. The second transistor M11/2 is then turned on. The rise of the current through the second transistor M11/2 is limited by an auxiliary and second inductor L11/6, therefore the turn-on losses of the second transistor M11/2 will be limited.

The first inductor L1/3 is large and will keep its current constant during commutation, therefore as the current in the second inductor L11/6 increases the current in the first diode D1/4 will decrease with the same amount. When the current in the second inductor L11/6 equals the current in the first inductor L1/3 the current in the first diode D1/4 will be zero. Due to reverse recovery the current in the first diode D1/4 will go negative and the current in the second inductor L11/6 will continue to rise until the first diode D1/4 is turned off. When the first diode D1/4 is turned off the current in the second inductor L11/6 is larger than the current in the first inductor L1/3, therefore the excess current is forced to go in the reverse direction in the first transistor M1/1. At first this current will discharge the drain-source capacitance of the first transistor M1/1, after that the current will free-wheel in the body-diode of the first transistor M1/1.

Now the first transistor M1/1 is turned on. The turn on will be free of losses because the capacitance of the first transistor M1/1 is already discharged and the voltage over it is zero. At the same moment the second transistor M11/2 is turned off. This will force the current in the second inductor L11/6 to commutate from the second transistor M11/2 to a third diode D12/10 and a second capacitor C11/8. The second capacitor C11/8 is initially discharged. During this period the voltage over the second transistor M11/2 equals the voltage of the second capacitor C11/8, therefore the turn-off losses of the second transistor M11/2 will be minimal.

After that two possibilities will arise:

1. The second capacitor C11/8 is now charged to the output voltage by the current in the second inductor L11/6. When the second capacitor C11/8 is fully charged a further diode a fourth diode D13/9 starts to conduct. The current in the second inductor L11/6 will now decrease with a constant rate depending on the output voltage and the value of the second inductor L11/6. At the same time the current in the first transistor M11/1 will increase so that the total current is constant, equal to the current in the first inductor L1/3.

2. During charging of the second capacitor C11/8 the current in the second inductor L11/6 decreases. Eventually the current is zero and the second capacitor C11/8 keeps its charge to a voltage between zero and the output voltage.

Both possibilities may continue in the same manner: Because of the reverse recovery in the third diode D12/10 the current in the second inductor L11/6 will be negative before the third diode D12/10 (and the fourth diode D13/9) are turned off. When the third diode D12/10 turns off, the current in the second inductor L11/6 will commutate to a further a sixth diode D15/11 and a second resistor R15/12. The current in the second inductor L11/6 is now damped by the second resistor R15/12 and will rapidly decrease to zero. The current now flows through the first inductor L1/3 and the first transistor M1/1, there is no current in the so called snubber circuit, and the second capacitor C11/8 is charged to a voltage between zero and the output voltage.

After that the first transistor M1/1 turns off. The current in the first inductor L1/3 is commutated from the first transistor M1/1 to the second capacitor C11/8 and the fourth diode D13/9 to the output. The voltage over the first transistor M1/1 equals the output voltage minus the voltage ever the second capacitor C11/8. This voltage is usually less than the output voltage and the turn off losses therefore are small. The current in the first inductor L1/3 will discharge the second capacitor C11/8 through the fourth diode D13/9. A further diode, a fifth diode D14/13 and a first resistor R14/14 prevent the second capacitor C11/8 from being overdischarged due to inductance and slow turn on of the first diode D1/4. The commutation from the fourth diode D13/9 to the first diode D1/4 will be slow and without oscillations and also without reverse recovery in the fourth diode D13/9. The first resistor R14/14 will control the speed of the commutation.

When the voltage over the first transistor M1/1 rises, the voltage over the second transistor M11/2 is also forced to rise by a current through the second inductor L11/6. The link of the fifth diode D14/13 and the first resistor R14/14 has earlier prevented the voltage over the second capacitor C11/8 to become negative. This has the effect that no extra current is needed in the second inductor L11/6 to charge the second capacitor C11/8 and the current in the second inductor L11/6 is decided only by the output capacitance of the second inductor L11/6. The second inductor L11/6 is discharged through three diodes, which makes the current in the second inductor L11/6 to quickly decrease to zero. This prevents any further diode reverse recovery, when the second transistor is turned on again and the switching period is completed.

Figure 2:
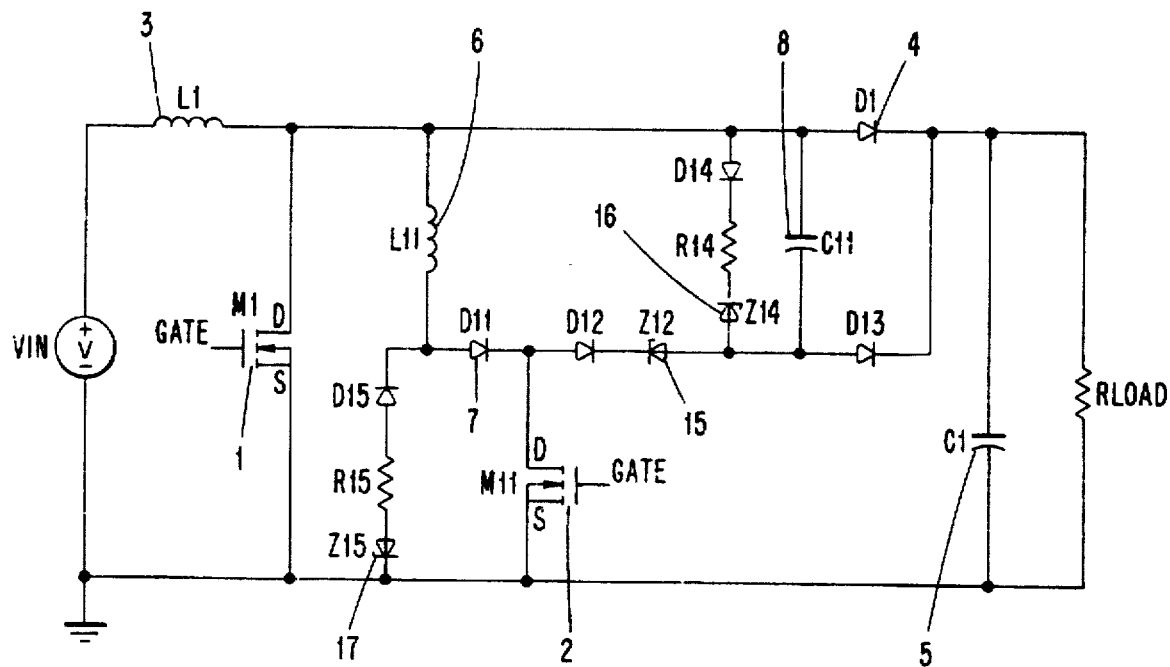
FIG. 2 shows the circuit in FIG. 1 with inserted zener diodes.

With a first zener diode Z14/16 inserted a more rapid and definite commutation is achieved from the fourth diode D13/9 to the first diode D1/4. With a second zener diode Z15/17 a more rapid damping of the current in inductor L11/6 is achieved after turn off of the second transistor M11/2. With a third zener diode Z12/15 a more rapid discharge is achieved of the second inductor L11/6 after turn off of the first transistor M1/1. In FIG. 2 the zener diodes Z12, Z14 and Z15/15,16,17 are inserted.

In FIGS. 3 A–G different waveforms are shown illustrating $U_{DS}$ drain source for M1, $U_{GS}$ gate source for M1, $U_{DS}$ for M11, $U_{GS}$ for M11, $U_{C11}$, $I_{D1}$ and $I_{L11}$.

While the foregoing description includes numerous details and specificities, it is to be understood that these are merely illustrative of the present invention, and are not to be construed as limitations. Many modifications will be readily apparent to those skilled in the art which do not depart from the spirit and scope of the invention, as defined by the appended claims and their legal equivalents.

We claim:

1. A method for power conversion using boost topology with loss-less snubber circuit comprising a first inductive element, a first electronic switch for controlling the flow of a forward current from said first inductive element to a first rectifying element and charging a first capacitive element, said first switch having a parasitic capacitance and being cyclically turned on and off and discharging the parasitic capacitance of said first switch, while minimizing turn on losses in said first switch and losses caused by reverse recovery current from said first rectifying element, wherein the method further comprises the steps of:

directing the flow of forward current from said first inductive element, and the flow of reverse recovery current from said first rectifying element, to a second inductive element in series with a second rectifying element to allow for the discharge of said parasitic capacitance, when said first switch is turned off by turning on a second switch, directing the flow of current from said second inductive element to a third rectifying element connected to a second capacitive element, which acts to limit the voltage across said first and said second electronic switches, when each of said electronic switches, respectively, is turned off, directing current from ground to said second inductive element through a sixth rectifying element to absorb the reverse recovery current from said second rectifying element, when said second switch is turned off, directing the flow of current from said first inductive element to a fifth rectifying element when said first switch is turned off and said second capacitive element is discharged, thereby preventing the voltage across said second capacitive element to become negative, directing the flow of current from said first inductive element to the first rectifying element when said first switch is turned off and the voltage across said first switch is equal to the voltage across said first capacitive element thereby assuring that the current in a fourth rectifying element is zero, and directing the flow of current from said second inductive element to at least three rectifying elements to assure that the current in said second inductive element decreases rapidly to zero, when parasitic capacitance of said second switching element has been charged.

2. A method according to claim 1, wherein said fifth rectifying element comprises a series combination of a diode and a resistor.

3. The method according to claim 1, wherein said fifth rectifying element comprises a series combination of diode and a zener diode.

4. The method according to claim 1, wherein said fifth rectifying element comprises a series combination of a diode, a zener diode, and a resistor.

5. The method according to claim 1, wherein said third rectifying element comprises a series combination of a diode and a zener diode.

6. The method according to claim 1, wherein said sixth rectifying element comprises a series combination of a diode and a resistor.

7. The method according to claim 1, wherein said sixth rectifying element comprises a series combination of a diode and a zener diode.

8. The method according to claim 1, wherein said sixth rectifying element comprises a series combination of a diode, a zener diode and a resistor.

9. A device for power conversion using boost topology with loss-less snubber circuit comprising:
- a first inductor and a first diode connected in series from an input to an output,
- a first transistor connected from a point between the first inductor and the first diode to ground,
- a second inductor, a second diode and a second transistor connected in series from the point between the first inductor and the first diode to ground, and
- a third and fourth diode connected in series from a point between the second diode and the second transistor to the output.

10. The device according to claim 9, wherein a second capacitor is connected from a point between the third and fourth diodes to the point between the first inductor and the first diode.

11. The device according to claim 10, wherein a fifth diode is connected in parallel with the second capacitor.

12. The device according to claim 10, wherein a fifth diode in series with a first resistor are connected in parallel with the second capacitor.

13. The device according to claim 10, wherein a fifth diode in series with a first zener diode are connected in parallel with the second capacitor.

14. The device according to claim 10, wherein a fifth diode in series with a first resistor and a first zener diode are connected in parallel with the second capacitor.

15. The device according to any of claim 10, wherein a sixth diode is connected from ground to between the second indicator and the second diode.

16. The device according to any of claim 10, wherein a sixth diode in series with a second resistor are connected from ground to between the second inductor and the second diode.

17. The device according to any of claim 10, wherein a sixth diode in series with a second zener diode are connected from ground to between the second inductor and the second diode.

18. The device according to any of claim 10, wherein a sixth diode in series with a second resistor and a second zener diode are connected from ground to between the second inductor and the second diode.

19. The device according to any of claim 10, wherein a third zener diode is inserted in series with the third diode.

* * * * *